United States Patent
Corsi et al.

[11] Patent Number: 5,886,554
[45] Date of Patent: Mar. 23, 1999

[54] SLEW-RATE LIMITED DIFFERENTIAL DRIVER WITH IMPROVED SKEW CONTROL

[75] Inventors: Marco Corsi; Raghunath Cherukuri, both of Dallas, Tex.

[73] Assignee: Texas Instruments Incorporated, Dallas, Tex.

[21] Appl. No.: 813,246

[22] Filed: Mar. 7, 1997

Related U.S. Application Data

[60] Provisional application No. 60/013,051, Mar. 8, 1996.

[51] Int. Cl.[6] ........................................ H03K 5/12
[52] U.S. Cl. .................... 327/170; 327/345; 327/134; 327/103
[58] Field of Search .................... 327/170, 103, 327/336, 345, 132, 134, 130, 374

[56] References Cited

U.S. PATENT DOCUMENTS

| | | | |
|---|---|---|---|
| 4,195,235 | 3/1980 | Schoeff | 327/362 |
| 4,361,771 | 11/1982 | Reinke | 327/361 |
| 4,896,333 | 1/1990 | Can | 327/103 |
| 4,987,323 | 1/1991 | Fujita | 327/91 |
| 5,023,489 | 6/1991 | Macbeth | 327/345 |
| 5,025,172 | 6/1991 | Carroll et al. | 327/130 |
| 5,194,760 | 3/1993 | Braun et al. | 327/170 |
| 5,489,862 | 2/1996 | Risinger et al. | 327/108 |

*Primary Examiner*—Timothy P. Callahan
*Assistant Examiner*—Terry L. Englund
*Attorney, Agent, or Firm*—Robby T. Holland; Carlton H. Hoel; Richard L. Donaldson

[57] ABSTRACT

Slew-rate limited differential drivers are useful for reliable data transmission on longer un-terminated cables with longer stub lengths. Slew-rate limit can be achieved by the ratio of a constant current to a capacitor means. In order to have equal rise and fall times, an equal amount of current is steered into the capacitor means in opposite directions. This architecture has unequal propagation delays on the transition edges. This mismatch is directly attributable to the signal transfer in current steering means. The slew-rate limited differential driver corrects this problem by delaying the rising edge by the required amount using a second capacitor means and a diode means. And hence, the preferred embodiment has a better skew on the output.

3 Claims, 4 Drawing Sheets

SLEW-RATE LIMITED DIFFERENTIAL DRIVER WITH IMPROVED SKEW CONTROL

This is a Non Provisional application filed under 35 U.S.C. 119(e) and claims priority of prior provisional Ser. No. 60/013,051 of inventor Corsi et al. filed Mar. 8, 1996.

FIELD OF THE INVENTION

This invention is in the field of integrated circuits and more particularly relates to differential drivers.

BACKGROUND OF INVENTION

The Electronic Industry Association (EIA) 485 is an electrical standard, specifying balanced (differential) drivers and receivers for digital data transfer between interfaces of Data Transmission Equipment (DTE), such as a computer terminal, and Data Communication Equipment (DCE), such as a modem. Single ended data transmission suffers from susceptibility to Electromagnetic interference (EMI) noise coupling and generates EMI on the fast rise and fall edges of the data. Differential transmission techniques are not as susceptible to the noise since it is added to both lines in a common mode sense and thus the receiver does not see the longitudinal noise. Differential techniques simply do not generate as much EMI on the transition edges as long as the propagation skew is tolerable. It is very difficult, however, to achieve tolerable skew and to achieve acceptable slew rate control at the same time.

Conventional slew rate techniques using current steering architecture suffer from the unequal propagation delays of the controlled driver which makes the skew control cumbersome. These propagation delays can be directly attributed to the propagation delays in the transfer of signal from the input port to the output port of the current steering element, which may be, for example, a transconductor.

It is accordingly an object of the invention to provide a technique of achieving both slew control and skew in differential driver circuits.

Other objects and benefits of the invention will be apparent to those of ordinary skill in the art having the benefit of the description and drawings following herein.

SUMMARY OF INVENTION

Slew-rate limited differential drivers are useful for reliable data transmission on longer un-terminated cables with longer stub lengths. Slew-rate limit can be achieved by the ratio of a constant current to a capacitor means. In order to have equal rise and fall times, an equal amount of current is steered into the capacitor in opposite directions. This architecture has unequal propagation delays on the transition edges. This mismatch is directly attributable to the signal transfer in current steering means. The present invention provides improvement in slew rate control by adding a capacitor means in the voltage to current converter that is scaled to match the slew rate control capacitor in the integrator and by additionally adding a diode means. The additional capacitor and diode delay the rising edge of the voltage input to the current mirror in the voltage to current converter. The delay in the rising edge matches the propagation delays. Thus, both slew control and skew control are achieved.

DESCRIPTION OF PREFERRED EMBODIMENT

Figure 1:
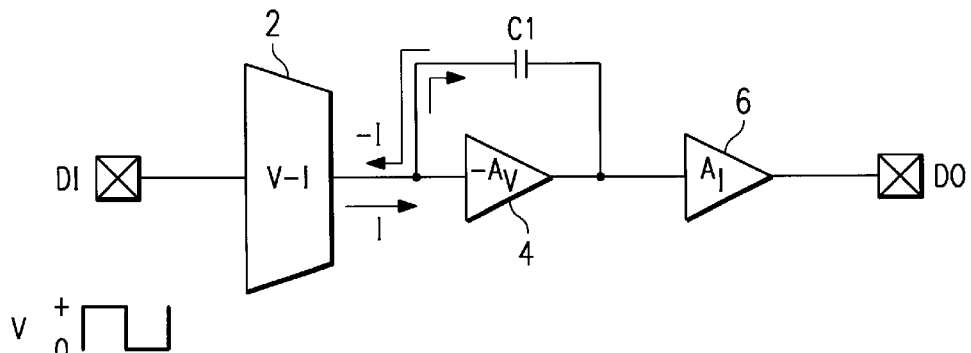
FIG. 1 is a block diagram of the noninverting channel of a differential driver circuit incorporating the inventive slew-rate control circuit.

FIG. 1 is a block diagram of a noninverting channel of a differential driver circuit incorporating the invention. Of course, as readily known by one of ordinary skill in the art, there exists another identical channel with an inverting output of the data, and, skew is defined as the difference in the propagation delay of the inverting and noninverting outputs. The digital input signal DI goes to a transconductor 2 which converts the voltage signal to a current signal. An inverter 4 with a capacitor C1 in the feedback path is configured as an integrator. For a constant current I and a known value of C1, the rate of rise of voltage at the output of inverting stage 4 is determined by the ratio of the value of the current I to the value of the capacitor C1. This defines the slew rate in the circuit. A current buffer 6 provides the required current gain and the low impedance that is required by transmission lines.

Figure 2:
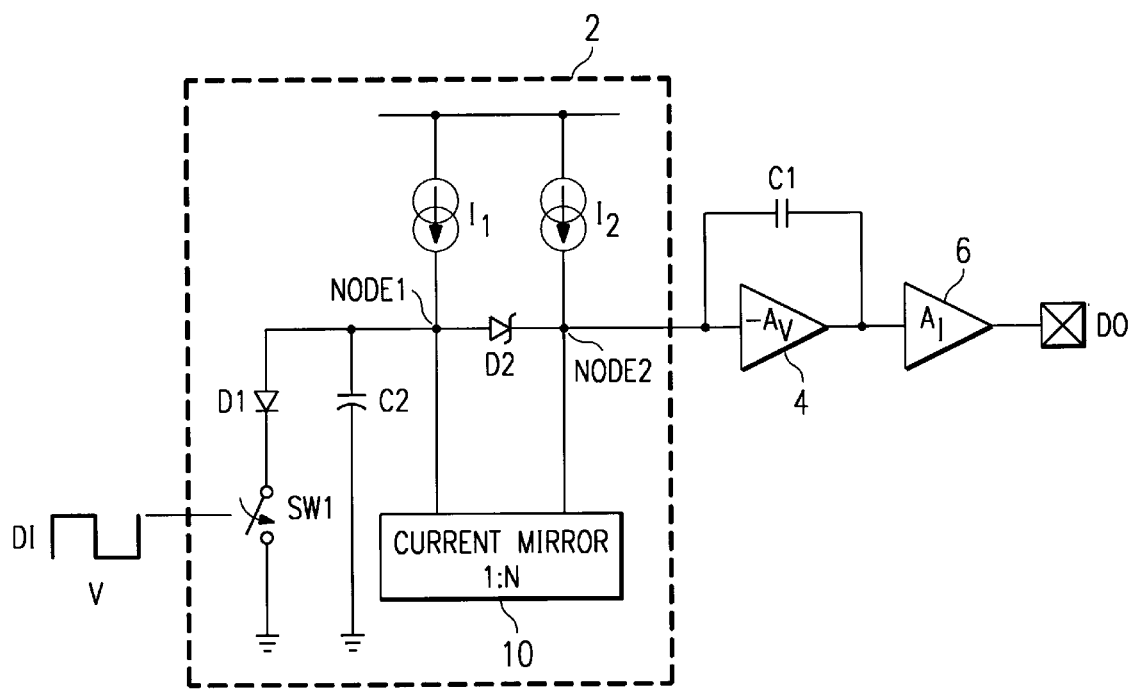
FIG. 2 is partial schematic partial block diagram showing the inventive slew-rate control circuit.

FIG. 2 shows the preferred embodiment to implement the voltage to current conversion. It consists of a current mirror 10 and two current sources I1 and I2 as the load to the current mirror. The input port node 1, is connected to a switch SW1 through a diode means D1. The output port node 2, is connected to the inverter 4. When switch SW1 is closed, it provides a low impedance path to node 1 and thus I1 is diverted away from the current mirror. This causes the current I2 to go into capacitor C1 thus slewing the output down to voltage output low (VOL). When switch SW1 is open, I1 goes to the mirror 10 as does I2. By choosing the ratio of I1 and I2, or the current mirror ratio, an equal amount of current can be made to flow in capacitor C1 in the opposite direction to slew the output to voltage output high (VOH). Switch SW1 can be controlled by the input voltage signal DI. There is an inversion of voltage at node 2 with respect to node 1 in this kind of current conversion or current steering. The voltage swings at both the nodes should be properly designed to have equal propagation delays on the transition edges when performing this signal transfer.

In FIG. 2, a diode D2 sets up the lower limit on the voltage swing at node 1. The diode D2 is illustrated as a zener diode. Node 2 has to rise to 2*Vbe before it can slew the output to VOL. On the rising edge there is no delay and the transition starts sooner. The rising edge is delayed at node 1 in order to match the propagation delays. This is accomplished by capacitor C2 means. The value is chosen to correct for propagation delay mismatch. The current mirror 10 is a two port network, having an input port node 1 and an output port node 2. Implementing the voltage to current conversion, or current steering, as two port network, provides separation of the output and input. This allows slew control of the output which is the voltage at node 2 (by giving a signal at node 1) and control of the skew by delaying the signal at the input port node 1. Specifically, the skew needs to be adjusted when node 2 wants to fall to a ground. (It has to first charge up to about 2Vbe before it can begin to fall.) So there is a time (a 2Vbe period) in which the rising edge needs correction. This is done by adding the capacitor C2 at the input node 1 which delays the input signal. Hence, a voltage skew of about zero is accomplished while performing slew rate control. The rising and falling edges are separately controlled by capacitors C1 and C2. The midpoints of the rising and falling edges can be aligned at the same time. The edges can be moved during the transition periods by appropriately sizing C1 and C2 as explained below.

Before, explaining the sizing of C1 and C2, however, a brief explanation of various examples of diode means D1 and capacitor means C2 is provided. A semiconductor process flow such as a linear bi-complementary metal oxide (LinBICMOS) flow can be used to manufacture the differential driver. Such a flow manufactures both bipolar and CMOS devices on a semiconductor substrate. Examples of a capacitor could include 1st and 2nd polysilicon layers separated by an oxide dielectric or a 1st polysilicon layer and an N-well diffusion separated by a dielectric or a metal layer-and a polysilicon layer separated by a dielectric. Examples of a diode could include a well and substrate, an N-well with base doped, a base emitter diode in an NPN device or a Shottky diode.

Figure 3A:
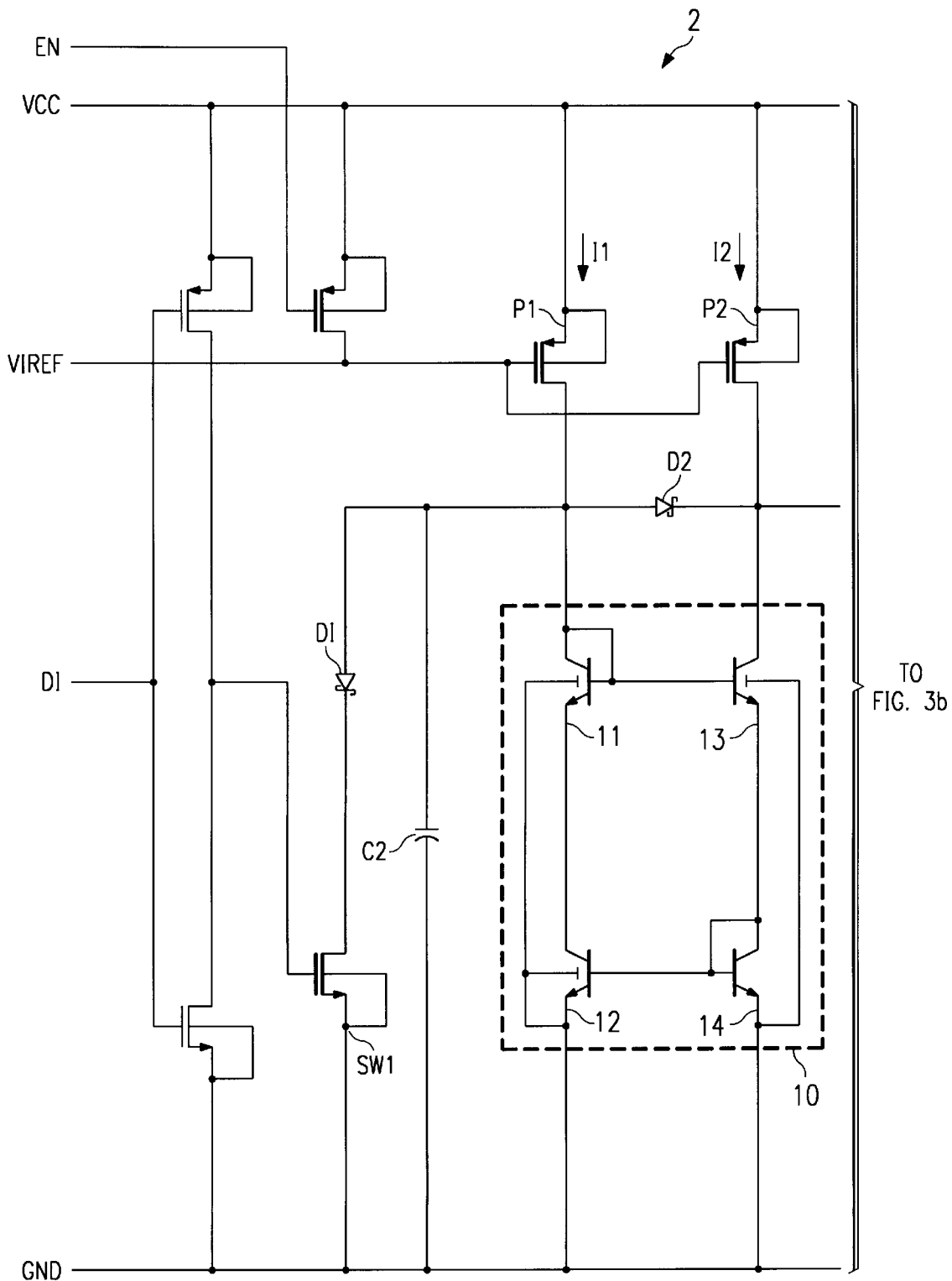
FIGS. 3a–3c are a schematic diagram of FIGS. 1 and 2.
Figure 3B:
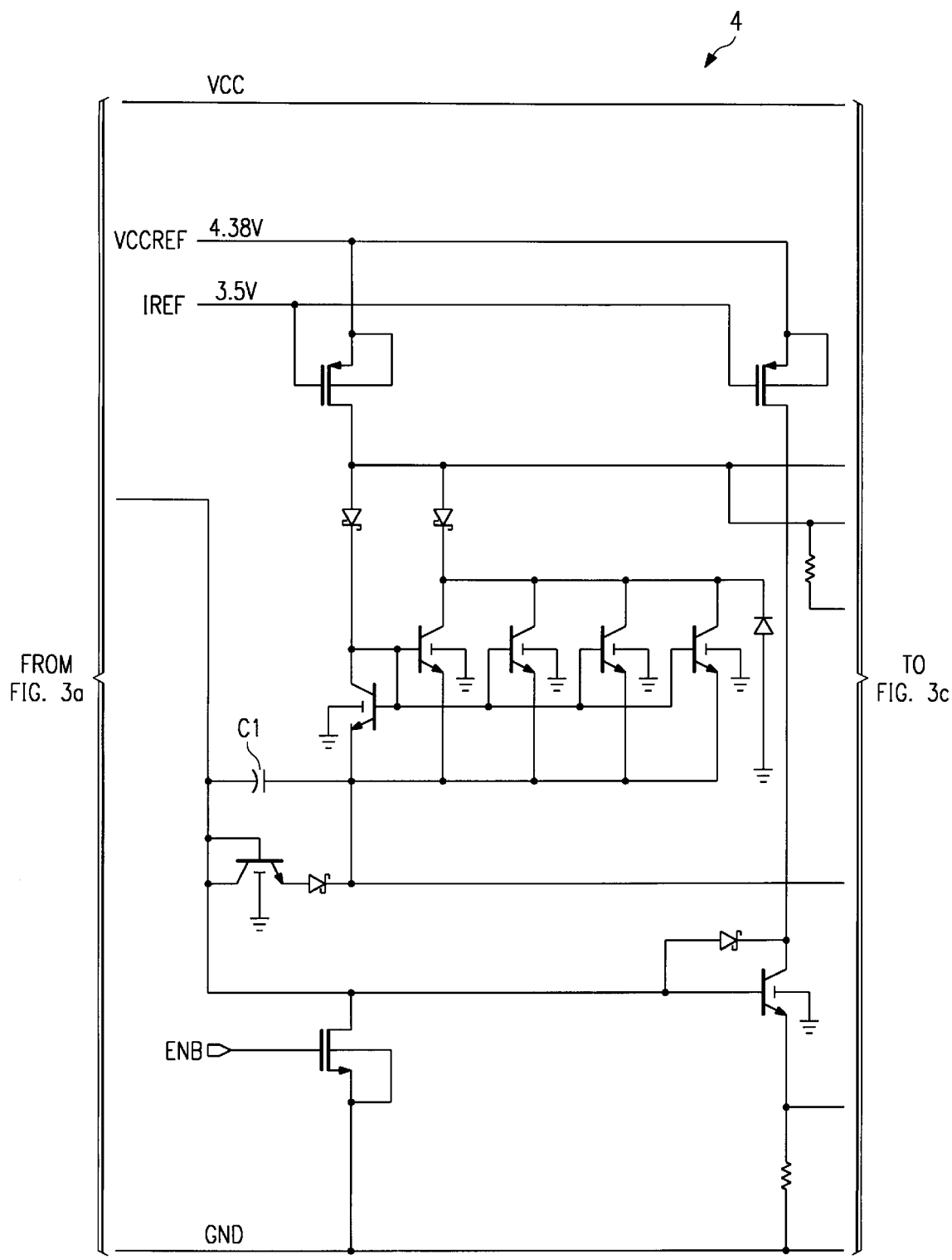
Figure 3C:
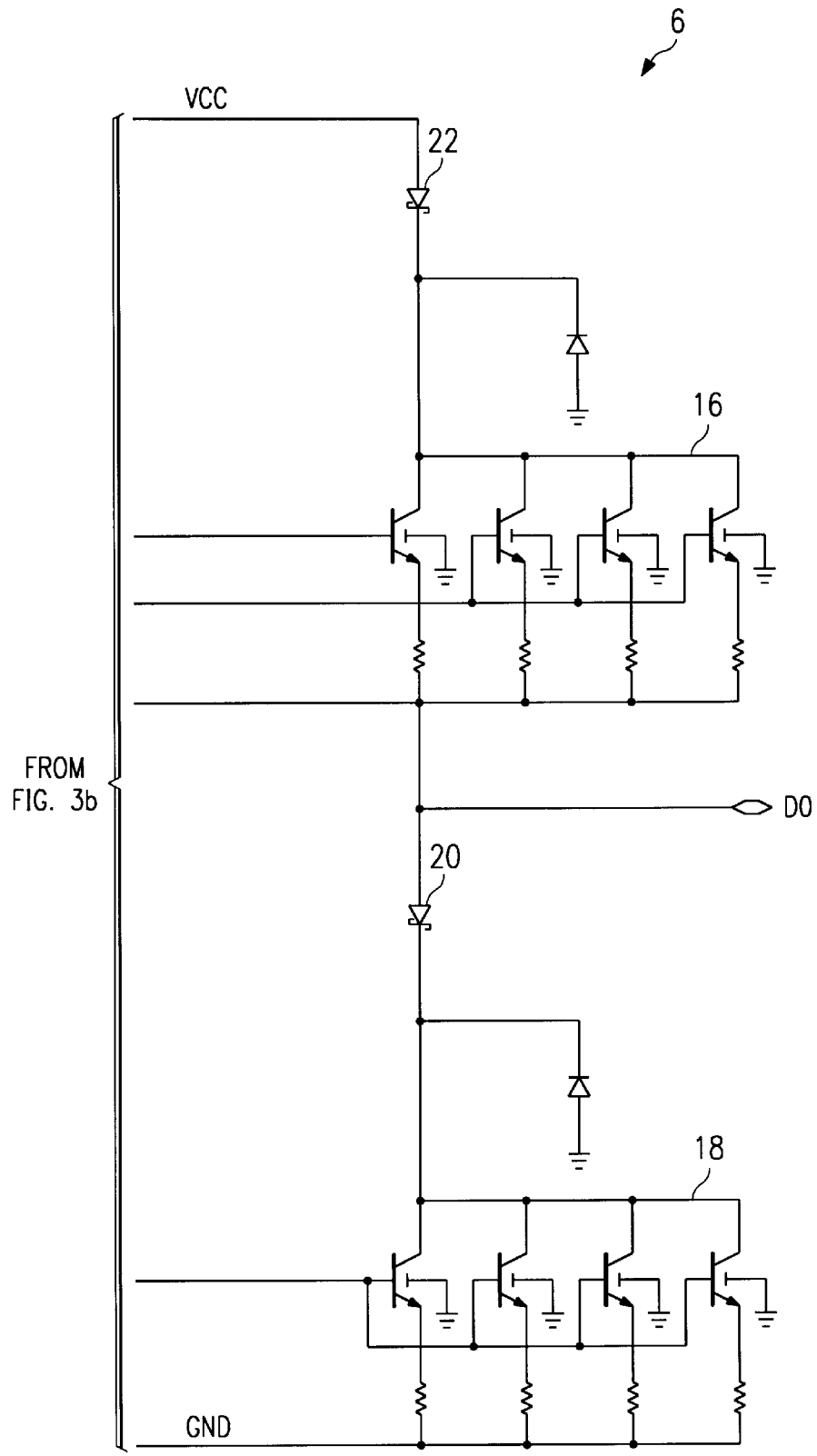

FIGS. 3a–3c are electrical schematic diagrams of FIGS. 1 and 2. Two cases of implementating the equation which determine the relation between C2 and C1 which are in terms of I1 and I2 are discussed in relationship to current mirror 10. The slew depends on the speed and is a dV/dT, or is expressed as a ratio of current or capacitor. This allows the current to be chosen which then determines the value of the capacitance by the ratio IN/C. Current I should have a meaningful value for all variations of supply temperature and semiconductor process and should be able to give enough margin for slewing. In case 1, if I2 is twice as large as I1, then C2 is twice as large as C1. Referring to FIG. 3a, I1 is supplied through a P channel MOS transistor P1 having a width W1 and a length L1. Similarly, I2 is supplied through a P channel MOS transistor P2 having a width W2 and a length L2. A transistor size is determined by dividing its width W by its length L. If I2 is twice as large as I1, then L1 and L2 are the same size and W2 is twice as large as W1. The gain of bipolar NPN transistors 11–14 is all equal in this example. This provides a value of 1 for N in current mirror 10 and hence the current mirror is 1 to 1. Accordingly, C1 and C2 will be the same size. In case 2, I1 and I2 are equally sized. This occurs by letting W1 equal W2 and L1 equal L2 in P channel transistors P1 and P2. Now, the gain (A) in bipolar NPN transistors 11–14 is changed such that transistors 13 and 14 are the same size and have twice the gain as transistors 11 and 12. This provides a value of 2 for N in current mirror 10 and hence the current mirror is 1 to 2. Accordingly, C1 and C2 are the same size. In a practical design implementation, if the data input is 125 Khz and ranges from 0 to 5 volts, the slew rate will be about 650 nanoseconds. Choosing the current to have a value of about 150 microamps provides a capacitor value of about 40 picofarads, FIG. 3b shows the capacitor C1 connected to the electrical schematic of inverter 4.

Reference is now made to current buffer 6 in FIG. 3c. The circuit employs a high side driver 16 which sources current into the output and a low side driver 18 which sinks current from the data output DO pin to ground. The upper and lower stages are controlled such that the current is either sourced or sinked to the load. Since current buffer 6 employs differential technology, there are two pairs of high side and low side drivers working 180 out of phase with each other. The low side driver 18 is typically a bipolar NPN transistor or a large NMOS transistor. In either case, there is a parasitic P-N junction between the device pin DO and ground. Negative common mode voltages more than a diode could cause the diode to forward bias and (a) draw excessive current, and (b) clamp the active driver from transmitting data. The excess current could even cause the device to latch-up. Large Schottky (diode) 20 employed as blocking device is used to avoid these effects. The high side driver 16 has a similar diode 22 to prevent the transistor from breaking down to common mode voltages above 5V.

A typical application that exploits the superior noise handling feature of the balanced techniques is industrial process control and process information gathering. The communication wires may run as separate buses from building or can be grouped with power cables. A differential driver with slew rate limit makes the network more tolerant of cable impedance mismatches. This allows longer un-terminated cable runs and longer stub lengths from the main backbone cable than would be possible with uncontrolled and faster voltage transitions.

The above described embodiment provides a circuit technique for slew rate control with better skew control A degree of freedom to control the propagation delay on the rising edge allows control on the propagation skew. A replica scheme using a diode and a capacitor scaled properly to match the slew rate control capacitor balances rise time and fall time. The invention advantageously allows freedom to control skew independently of slew rate. A skew approaching zero is obtainable with whatever slew is desired.

While the invention has been described with reference to illustrative embodiments, this description is not intended to be construed in a limiting sense. Various other embodiments of the invention will be apparent to persons skilled in the art upon reference to this description. It is contemplated that the appended claims will cover the above embodiments and any such modifications as fall within the true scope and spirit of the invention.

What is claimed is:

1. A slew rate limited differential driver, comprising:
   a current buffer;
   an integrator, coupled to the input of the current buffer, having a slew rate control capacitor; and
   a voltage to current convertor, coupled to the input of the integrator, having a capacitor matched to the slew rate control capacitor in the integrator.

2. The driver of claim 1 wherein the voltage to current converter additionally includes a diode coupled to the converter's capacitor.

3. The driver of claim 2 wherein the voltage to current converter includes a two port current mirror and wherein the diode and the converter's capacitor are coupled to an input port of the current mirror.

* * * * *